US011829168B2

(12) United States Patent
Severson et al.

(10) Patent No.: US 11,829,168 B2
(45) Date of Patent: Nov. 28, 2023

(54) POWER MANAGEMENT CIRCUIT INCLUDING ON-BOARD CURRENT-SENSE RESISTOR AND ON-DIE CURRENT SENSOR

(71) Applicant: QUALCOMM Incorporated, San Diego, CA (US)

(72) Inventors: Matthew Severson, Austin, TX (US); Timothy Zoley, Raleigh, NC (US); Lipeng Cao, La Jolla, CA (US); Kevin Bradley Citterelle, San Diego, CA (US); Richard Gerard Hofmann, Cary, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 386 days.

(21) Appl. No.: 17/088,066

(22) Filed: Nov. 3, 2020

(65) Prior Publication Data

US 2021/0173419 A1 Jun. 10, 2021

Related U.S. Application Data

(60) Provisional application No. 62/945,188, filed on Dec. 8, 2019.

(51) Int. Cl.
*G05F 1/46* (2006.01)
*G01K 7/18* (2006.01)
(Continued)

(52) U.S. Cl.
CPC ............... *G05F 1/46* (2013.01); *G01K 7/18* (2013.01); *G01R 19/0092* (2013.01);
(Continued)

(58) Field of Classification Search
CPC .. G06F 1/46; G06F 1/324; G01K 7/18; G01R 19/0092; H05K 1/181
See application file for complete search history.

(56) References Cited

U.S. PATENT DOCUMENTS 10,255,231 B1 * 4/2019 Briggs .................. G06F 1/3243
2004/0003301 A1 * 1/2004 Nguyen .................. G06F 1/206
713/300
(Continued)

FOREIGN PATENT DOCUMENTS

EP          2753148 A1    7/2014
WO    2017222165 A1   12/2017

OTHER PUBLICATIONS

International Search Report and Written Opinion—PCT/US2020/058946—ISA/EPO—dated Feb. 26, 2021.

*Primary Examiner* — Jaweed A Abbaszadeh
*Assistant Examiner* — Gayathri Sampath
(74) *Attorney, Agent, or Firm* — Loza & Loza, LLP (57) ABSTRACT

An apparatus including a printed circuit board (PCB) including a sense resistor; and an integrated circuit (IC) mounted on the PCB, wherein at least a portion of the IC draws current from a power rail, wherein the sense resistor is coupled between the power rail and the IC, wherein the sense resistor is configured to produce a sense voltage in response to the current drawn by the at least portion of the IC, and wherein the IC includes a current sensor configured to generate a signal indicative of the current drawn by the at least portion of the IC based on the sense voltage.

33 Claims, 7 Drawing Sheets

(51) Int. Cl.
| | |
|---|---|
| *G01R 19/00* | (2006.01) |
| *G06F 1/3206* | (2019.01) |
| *G06F 1/324* | (2019.01) |
| *H05K 1/18* | (2006.01) |
| *H05K 1/16* | (2006.01) |
| *G01K 7/42* | (2006.01) |
| *G06F 1/3296* | (2019.01) |
| *G01R 19/32* | (2006.01) |
| *G01R 1/20* | (2006.01) |
| *G01R 19/165* | (2006.01) |
| *G01R 19/25* | (2006.01) |
| *G06F 15/78* | (2006.01) |
| *G06N 5/04* | (2023.01) |

(52) U.S. Cl.
CPC ............ *G06F 1/324* (2013.01); *G06F 1/3206* (2013.01); *H05K 1/181* (2013.01); *H05K 2201/10151* (2013.01)

(56) References Cited

U.S. PATENT DOCUMENTS

| | | | |
|---|---|---|---|
| 2008/0265850 A1* | 10/2008 | De Lima Filho | G01R 19/0092 323/265 |
| 2012/0274153 A1 | 11/2012 | Maxwell et al. | |
| 2015/0028898 A1 | 1/2015 | Hanssen et al. | |
| 2015/0268277 A1 | 9/2015 | Marten | |
| 2016/0268042 A1* | 9/2016 | Roth | H01F 38/30 |
| 2016/0342167 A1* | 11/2016 | Zhou | G05F 1/56 |
| 2017/0083069 A1* | 3/2017 | DiBene, II | G01R 19/255 |
| 2017/0315944 A1* | 11/2017 | Mayer | G06F 13/24 |
| 2018/0188800 A1 | 7/2018 | Alon | |
| 2019/0124735 A1 | 4/2019 | Liu et al. | |
| 2021/0064120 A1* | 3/2021 | Wang | G06F 1/3296 |

\* cited by examiner

POWER MANAGEMENT CIRCUIT INCLUDING ON-BOARD CURRENT-SENSE RESISTOR AND ON-DIE CURRENT SENSOR

CROSS-REFERENCE TO RELATED APPLICATION

This application claims the benefit of the filing date of U.S. Provisional Application, Ser. No. 62/945,188, filed on Dec. 8, 2019, which is incorporated herein by reference.

FIELD

Aspects of the present disclosure relate generally to integrated circuits (ICs), and in particular, to an apparatus including a printed circuit board (PCB) and an integrated circuit (IC), such as a system on chip (SOC) type IC, with a power management circuit having an on-board current-sense resistor and an on-die current sensor.

DESCRIPTION OF RELATED ART

Power or current limit management for circuits is of concern to maintain safe and reliable operations of the circuits. An integrated circuit (IC), such as a system on chip (SOC), may include one or more cores, such as signal processing cores, that may be drawing power or current from an off-chip power or supply voltage rail in performing its or their intended operations. In some situations, the power or current drawn by the one or more cores may exceed one or more safety limits. If such safety limits are exceeded, the IC may experience a malfunction, or even worse, irreparable damage. Thus, monitoring the power or current drawn by an IC is of interests herein.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including an integrated circuit (IC) residing on a silicon substrate, wherein the IC includes a current sensor; and a sense resistor, not residing on the silicon substrate, coupled to a first input of the current sensor.

Another aspect of the disclosure relates to an apparatus including a printed circuit board (PCB); a sense resistor mounted on the PCB; and an integrated circuit (IC) mounted on the PCB, wherein at least a portion of the IC draws current from a power rail, wherein the sense resistor is coupled between the power rail and the IC, wherein the sense resistor is configured to produce a sense voltage in response to the current drawn by the at least portion of the IC, and wherein the IC includes a current sensor configured to generate a signal indicative of the current drawn by the at least portion of the IC based on the sense voltage.

Another aspect of the disclosure relates to a method including generating a sense voltage across a sense resistor based on current drawn by an integrated circuit (IC) residing on a silicon substrate, wherein the sense resistor does not reside on the silicon substrate; and generating a digital value inside the IC related to the current drawn by the IC based on the sense voltage.

Another aspect of the disclosure relates to an artificial intelligence (AI) inference apparatus including an integrated circuit (IC) residing on a silicon substrate, wherein the IC includes a current sensor and one or more artificial intelligence (AI) inference data processing cores; and a sense resistor, not residing on the silicon substrate, coupled to an input of the current sensor, and between a power rail and the one or more AI inference data processing cores.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Management of power or current drawn by circuits is of concern to ensure reliable performance of the circuits and reduce likelihood of failure of the circuits. Generally, the more power or current drawn by a circuit, the hotter the circuit operates. At some point, if the power or current drawn by the circuit is not properly managed, the temperature of the circuit may reach a point where the circuit is likely to fail.

In managing power or current drawn by a circuit, there are at least a couple aspects of the current that is of concern. These aspects include peak current and sustained current. A current that peaks above a defined limit may cause permanent damage to a circuit or affect circuit performance, such as timing errors including setup time violations in critical paths. When peak power current is exceeded for a regulator, the voltage may also dip (out of specified regulator range); and thus, the circuit could malfunction, e.g., hardware or software failures; some of which may be recoverable, but undesirable nonetheless. Thus, power or current management should monitor peak current and take appropriate actions to reduce the peak current if it exceeds a defined limit.

A sustained power or current, which is defined as power or current over a specified time interval, which is over a limit for a duration of a specified time interval, may also cause damage to a circuit. This is because the operating temperature of a circuit is a function of the energy density of the circuit, which is related to the consumed power over time. If the sustained current exceeds the current-time limit, the temperature of the circuit may exceed the junction temperature, which may lead to damage to the circuit. The sustained current limit is generally lower than the peak current rating, and there may be several limits associated with different time intervals or a continuous limit curve over time. Accordingly, power or current management should monitor sustained current and take appropriate actions to reduce the sustained current if it exceeds one or more defined limits.

Desirable characteristics of power or current management include a relatively large dynamic range, accuracy, and response time. A power or current management circuit should have a relatively wide dynamic range in sensing current from relatively low to relatively high currents (e.g., an 8× dynamic range)). If a small sense resistor of 5 milliOhms (mΩ) is used for low power dissipation purpose, the 8× dynamic range translates to 5 m Volt (V) to 40 mV. Above 40 mV, the accuracy of the current measurement may be impacted due to nonlinearity or other issues. Below 5 mV, the accuracy of the current measurement may be impacted due to noise affecting the relatively low voltages.

With regard to response time, a power or current management circuit should respond relatively fast when peak or sustained limits are exceeded. This is so that the current exceeding such limits does not cause damage before the power or current management circuit is able to respond to the limit violations. As an example, response time associated with rail current limits may be on the order of 200 to 500 nanoseconds (ns). Response time associated with board current limits should be on the order of 1 to 5 microseconds (µs). Different power or current management solutions offer different advantageous and disadvantageous aspects as discussed below.

Figure 1:
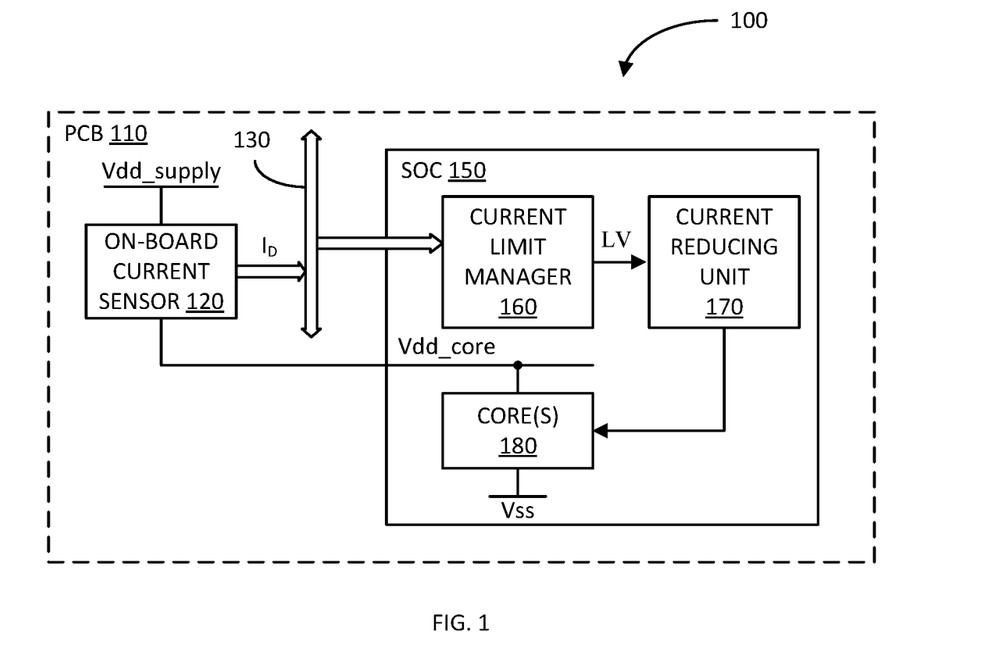
FIG. 1 illustrates a block diagram of an exemplary power management circuit with an on-board current sensor including a current-sense resistor in accordance with an aspect of the disclosure.

FIG. 1 illustrates a block diagram of an exemplary power management circuit 100 in accordance with an aspect of the disclosure. The power management circuit 100 includes an integrated circuit (IC) 150, such as a system on chip (SOC), mounted on a printed circuit board (PCB) 110. The SOC 150 may include one or more core(s) 180, which serve as examples of at least a portion of the IC (e.g., circuit(s) or load(s) (e.g., central processing units (CPUs), digital signal processors (DSP), etc.)) that draws current from a power rail Vdd_core. The power management circuit 100 manages the current drawn by the core(s) 180 to lower the current drawn by the core(s) if one or more power or current limits are violated.

In this regard, the power management circuit 100 includes an on-board current sensor 120 (often referred to as a "discrete power monitor") mounted on the PCB 110. The SOC 150 further includes a current limit manager 160 and a current reducing unit 170. The on-board current sensor 120 includes an internal current-sense resistor coupled between a supply voltage rail Vdd_supply and the power rail Vdd_core for the core(s) 180. The on-board current sensor 120 further includes an internal analog-to-digital converter (ADC), such as a sigma-delta ADC, to convert a sense voltage across the current-sensing resistor into a digital value $I_D$. The digital value $I_D$ is a measurement of the current drawn by the one or more core(s) 180. The digital value $I_D$ is provided to the current limit manager 160 of the SOC 150 by way of a data bus 130.

The current limit manager 160 compares the measured current $I_D$ to one or more limits (e.g., peak limit, sustained limits, etc.), and generates a limit violation (LV) signal indicative of whether there are any limit violations, and the nature of the violations if any. The current reducing unit 170 responds to the LV signal if it indicates one or more power or current limits violations. For example, the current reducing unit 170 may be a clock control unit, which reduces a frequency of a clock supplied to the one or more core(s) 180. As the amount of power or current drawn by the core(s) 180 depends on the frequency of the clock, reducing the clock frequency results in a reduction of the power or current drawn by the core(s) 180. The current reducing unit 170 may implement the current reduction in other manners, such as operating the one or more core(s) 180 in a lower power mode, disabling one or more of the core(s) 180, and/or other manners.

A drawback of the power management circuit 100 is the relatively long response time due to the current information being generated and provided to the current limit manager 160 by the on-board current sensor 120. As discussed, the on-board current sensor 120 has an internal ADC that consumes significant time to convert the sense voltage across the current-sense resistor into the digital value $I_D$. For example, some on-board current sensors may take up to 9 milliseconds (ms) to convert the sense voltage across the current-sense resistor into the digital value $I_D$, which in some power management applications this may not be acceptable. Additionally, the transfer of the digital value $I_D$ from the on-board current sensor 120 to the current limit manager 160 via the data bus 130 also adds another delay. For example, in some cases, the transfer of the data may take up to 90 μs. Thus, the power management circuit 100 may not be the appropriate solution if response time on the order of 100 to 500 ns is required.

Figure 2:
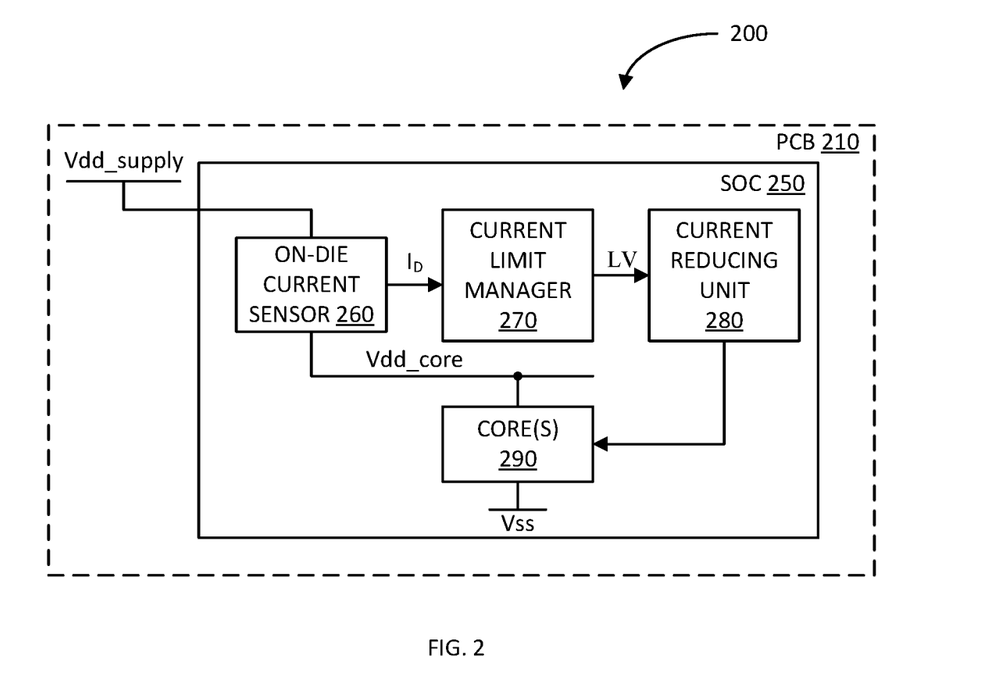
FIG. 2 illustrates a block diagram of another exemplary power management circuit with an on-die current sensor including a current-sense resistor in accordance with another aspect of the disclosure.

FIG. 2 illustrates a block diagram of another exemplary power management circuit 200 in accordance with another aspect of the disclosure. One solution for providing a faster response time, as compared to that of power management circuit 100, is to implement the current sensor in the IC. The power management circuit 200 is an example of such implementation.

In particular, the power management circuit 200 includes an integrated circuit (IC) 250, such as a system on chip (SOC), mounted on a printed circuit board (PCB) 210. The SOC 250 may include one or more core(s) 290, which serve as an example of at least a portion of the IC (e.g., circuit(s) or load(s) (e.g., CPUs, DSP, etc.)) that draws current from a power rail Vdd_core. The power management circuit 200 manages the current drawn by the core(s) 290 to lower the current drawn by the core(s) if one or more power or current limits are violated.

In this regard, the SOC 250 includes an on-die current sensor 260, a current limit manager 270 and a current reducing unit 280. The on-die current sensor 260 includes an internal current-sense resistor coupled between a supply voltage rail Vdd_supply and the power rail Vdd_core for the core(s) 290. The on-die current sensor 260 further includes an internal analog-to-digital converter (ADC) to convert a sense voltage across the current-sense resistor into a digital value $I_D$. The digital value $I_D$ is a measurement of the current drawn by the one or more core(s) 290. The digital value $I_D$ is provided to the current limit manager 270.

The current limit manager 270 compares the measured current $I_D$ to one or more limits (e.g., peak limit, sustained limits, etc.), and generates a signal LV indicative of whether there are any limit violations, and the nature of the violations if any. The current reducing unit 280 responds to the LV signal if it indicates one or more current limits violations. For example, the current reducing unit 280 may be a clock control unit, which reduces a frequency of a clock supplied to the one or more core(s) 290. As the amount of power or current drawn by the core(s) 290 depends on the frequency of the clock, reducing the clock frequency results in a reduction in the power or current drawn by the core(s) 290. The current reducing unit 280 may implement the current reduction in other manners, such as operating the one or more core(s) 290 in a lower power mode, disabling one or more of the core(s) 290, and/or other manners.

In the case of power management circuit 200, the response time is typically much faster than the response time of power management circuit 100. For example, there is no delay or less delay in transferring the digital value $I_D$ from the on-die current sensor 260 to the current limit manager 270, as an internal data bus through which the digital value $I_D$ is sent, may be designed for faster operations (e.g., higher clock frequency, parallel data transfer, etc.) than the external data bus 130. Further, the resolution of the internal ADC of the on-die current sensor 260 may be configured to provide the desired accuracy with the desired conversion delay. Thus, the on-die current sensor 260 may be designed to meet response time of 100 to 500 ns.

However, the power management circuit 200 may suffer from undesirable dynamic range. This is because, within the SOC 250, the sense resistor is typically implemented across two points of a power grid or across one or more block head switches (BHS). The resistance of the power grid or BHS is typically small; and, as a result, the one-die current sensor 260 may have difficulty in generating reliable or accurate current readings when the one or more core(s) 290 draws a relatively small amount of current.

Another drawback of the power management circuit 200 is that it is generally not that flexible. For example, the power management circuit 200 may be implemented in different products, such as M.2 or Peripheral Component Interconnect Express (PCIe) applications, where the current limits may vary significantly. Accordingly, the on-die current sensor 260 may need to be redesigned for the different applications so that the sense resistance is set in accordance with the requisite dynamic range. Such redesign of the on-die current sensor 260 typically involves a re-taping out of the SOC 250 for each distinct application, which may not be a desirable solution.

Figure 3A:
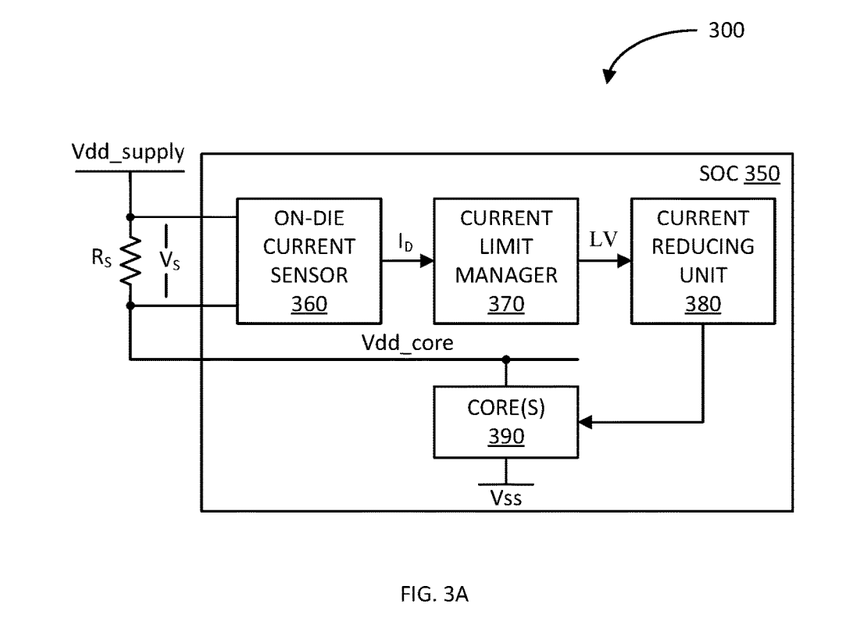
FIGS. 3A-3C illustrate block diagrams of various examples of power management circuits with an off-die current-sense resistor and an on-die current sensor in accordance with another aspect of the disclosure.

FIG. 3A illustrates a block diagram of another exemplary power management circuit 300 in accordance with another aspect of the disclosure. In summary, the power management circuit 300 includes an off-die current-sense resistor and an on-die current sensor. In this configuration, the power management circuit 300 achieves a fast response time as only a sense voltage across the sense resistor is provided to the on-die current sensor, which results in substantially no delay, and the resolution of the on-die current sensor may be configured to achieve the desired accuracy and response time. Additionally, by having the sense resistor not residing on the die or silicon substrate, the resistance of the sense resistor may be set to meet the dynamic range requirement of the power management circuit 300. Furthermore, the power management circuit 300 is more flexible for implementing in different applications with different dynamic ranges, as the value of the off-die current sense resistor may be tailored to meet the dynamic range requirements, without requiring a redesign or re-taping out of the SOC.

In particular, the power management circuit 300 includes an integrated circuit (IC) 350 residing on a silicon substrate, such as a system on chip (SOC). The SOC 350 may include one or more core(s) 390, which serve as an example of at least a portion of the IC (e.g., circuit(s) or load(s) (e.g., CPUs, DSPs, etc.)) that draws current from a power rail Vdd_core. The power management circuit 300 manages the current drawn by the core(s) 390 to lower the current drawn by the core(s) if one or more power and current limits are violated.

In this regard, the power management circuit 300 includes a current-sense resistor $R_S$, not residing on the silicon substrate, and situated between a supply voltage rail Vdd_supply and the power rail Vdd_core for the core(s) 390 of the SOC 350. The current drawn by the one or more core(s) 390 produces a sense voltage $V_S$ across the sense resistor $R_S$. The sense voltage $V_S$ is applied to an on-die current sensor 360 of the SOC 350.

The on-die current sensor 360 further includes an internal analog-to-digital converter (ADC) configured to convert the sense voltage $V_S$ into a digital value $I_D$. The digital value $I_D$ is a measurement of the current drawn by the one or more core(s) 390. The digital value $I_D$ is provided to the current limit manager 370. The current limit manager 370 compares the measured current $I_D$ to one or more limits (e.g., peak limit, sustained limits, etc.), and generates a signal LV indicative of whether there are any limit violations, and the nature of the violations if any. A current reducing unit 380 in the SOC 350 responds to the LV signal if it indicates one or more current limits violations. For example, the current reducing unit 380 may be a clock control unit, which reduces a frequency of a clock supplied to the one or more core(s) 390. As the amount of power or current drawn by the core(s) 390 depends on the frequency of the clock, reducing the clock frequency results in a reduction in the power or current drawn by the core(s) 390. The current reducing unit 380 may implement the current reduction in other manners, such as operating the one or more core(s) 390 in a lower power mode, disabling one or more of the core(s) 390, and/or other manners.

As discussed, the power management circuit 300 may be configured to have a relatively fast response time, as providing the sense voltage $V_S$ to the on-die current sensor 360 may be accomplished with substantially no delay. The resolution of the internal ADC of the on-die current sensor 360 may be configured to provide the desired accuracy and delay for converting the sense voltage $V_S$ into the digital value $I_D$. The resistance of the sense resistor $R_S$ may be configured to provide the desired dynamic range for different applications; thus, providing a flexible solution for different products.

Figure 3B:
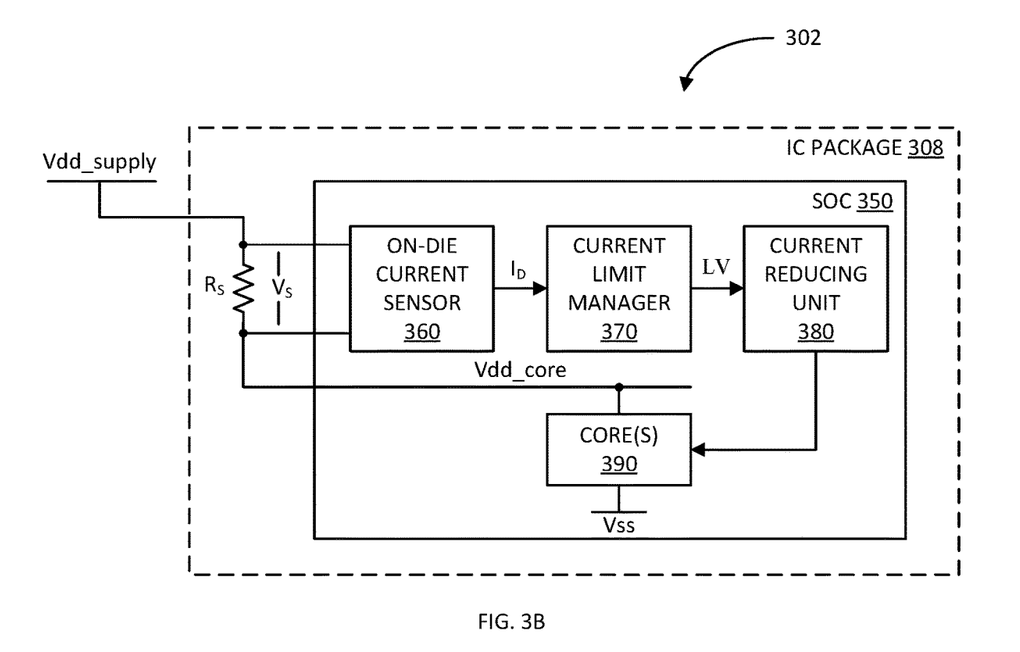

FIB. 3B illustrates a block diagram of another exemplary power management circuit 302 in accordance with another aspect of the disclosure. The power management circuit 302 may be a variation of power management circuit 300 previously discussed. In power management circuit 302, the off-die current-sense $R_S$ is situated within an IC package 308, within which the IC or SOC 350 resides.

Figure 3C:
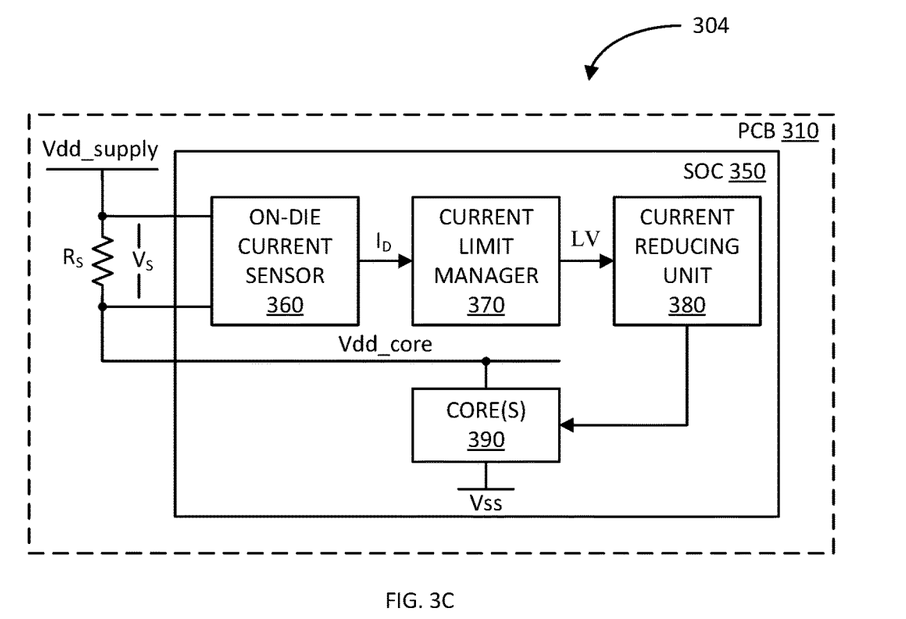

FIG. 3C illustrates a block diagram of another exemplary power management circuit 304 in accordance with another aspect of the disclosure. The power management circuit 302 may be a variation of power management circuit 300 previously discussed. In power management circuit 304, the off-die current-sense $R_S$ is mounted on a printed circuit board (PCB) 310; the IC or SOC 350, which may or may not be situated within an IC package, also being mounted on the PCB 310.

Figure 4:
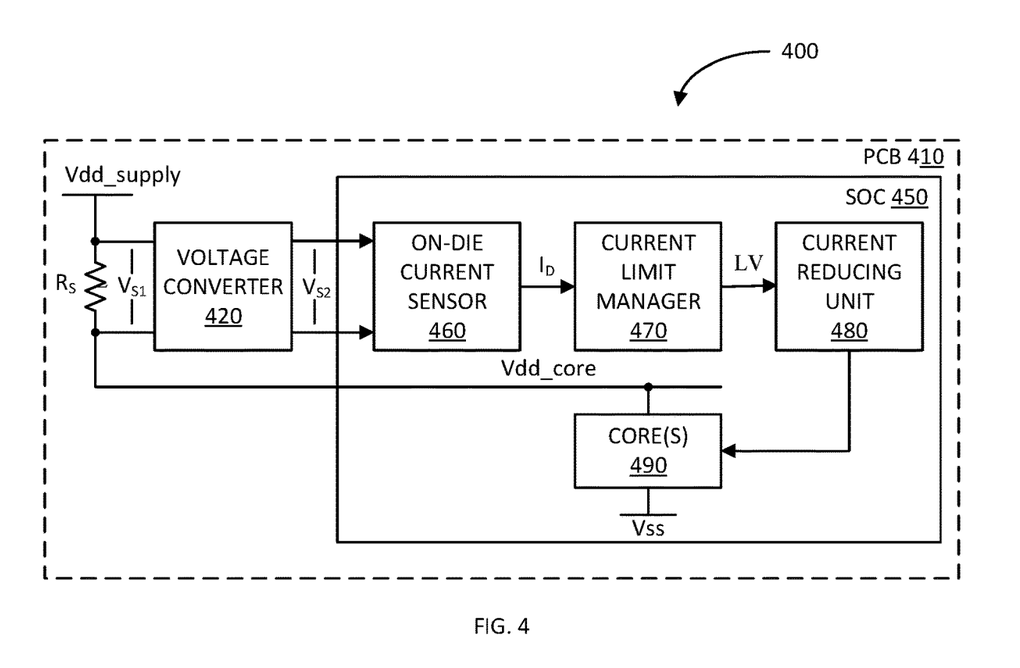
FIG. 4 illustrates a block diagram of another exemplary power management circuit with an on-board current-sense resistor and associated voltage converter, and an on-die current sensor in accordance with another aspect of the disclosure.

FIG. 4 illustrates a block diagram of another exemplary power management circuit 400 in accordance with another aspect of the disclosure. The power management circuit 400 is a variation of power management circuit 300, and includes many of the same elements as indicated by similar reference labels and numbers, with the exception that the most significant digit (MSD) of the reference numbers is a "4" in power management circuit 400 instead of a "3" as in power management circuit 300. Thus, the detailed explanation of common elements is provided above with respect to the description of power management circuit 300.

The power management circuit 400 differs from power management circuit 300 in that it further includes a voltage converter 420 between the current sense resistor $R_S$ and the on-die current sensor 460. In power management circuit 300, the supply voltage Vdd_supply is provided directly to the on-die current sensor 360. However, for different applications, the supply voltage Vdd_supply may be too high for the on-die current sensor to directly receive that voltage. In this regard, the voltage converter 420 down converts a sense voltage $V_{S1}$ across the current sense resistor $R_S$ to a lower sense voltage $V_{S2}$ suitable for the on-die current sensor 460. The remaining components of the SOC 450 operate in a similar manner as the corresponding ones of SOC 350 discussed above.

For completeness sake, the on-die current sensor 460 further includes an internal analog-to-digital converter (ADC) to convert the sense voltage $V_{S2}$ into a digital value $I_D$. The digital value $I_D$ is a measurement of the current drawn by the one or more core(s) 490. The digital value $I_D$ is provided to the current limit manager 470. The current limit manager 470 compares the measured current $I_D$ to one or more limits (e.g., peak limit, sustained limits, etc.), and generates a signal LV indicative of whether there are any limit violations, and the nature of the violations if any. The current reducing unit 480 responds to the LV signal if it indicates one or more current limits violations. For example, the current reducing unit 480 may be a clock control unit, which reduces a frequency of a clock supplied to the one or more core(s) 490. As the amount of power or current drawn by the core(s) 490 depends on the frequency of the clock, reducing the clock frequency results in a reduction in the power or current drawn by the core(s) 490. The current reducing unit 480 may implement the current reduction in other manners, such as operating the one or more core(s) 490 in a lower power mode, disabling one or more of the core(s) 490, and/or other manners.

Figure 5:
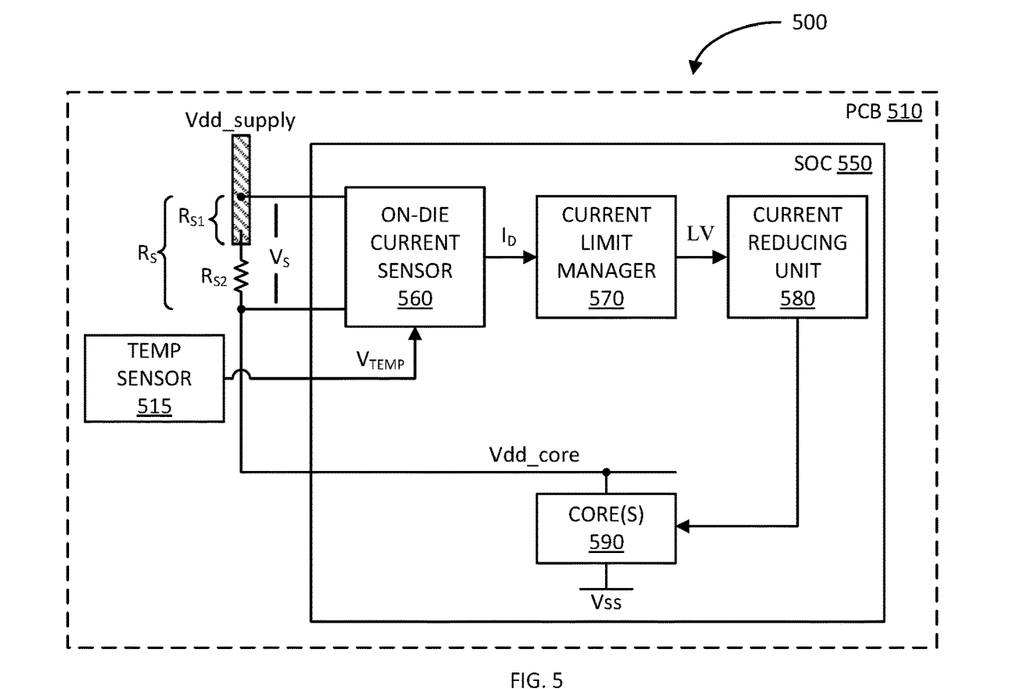
FIG. 5 illustrates a block diagram of another exemplary power management circuit with an on-board current-sense resistor including, at least in part, a resistance from board metallization trace and an associated on-board temperature sensor, and an on-die current sensor in accordance with another aspect of the disclosure.

FIG. 5 illustrates a block diagram of another exemplary power management circuit 500 in accordance with another aspect of the disclosure. The power management circuit 500 is another variation of the power management circuit 300, and includes many of the same elements as indicated by similar reference labels and numbers, with the exception that the most significant digit (MSD) of the reference numbers is a "5" in power management circuit 500 instead of a "3" as in power management circuit 300. Thus, the detailed explanation of common elements is provided above with respect to the description of power management circuit 300.

The power management circuit 500 differs from power management circuit 300 in that the current sense resistor $R_S$ may be implemented, at least in part, as a metallization (e.g., copper) trace on a PCB 510. The metallization trace on the PCB 510 has a resistivity, which, for example, in the case of a PCB copper trace is approximately $2.07 \times 10^{-8}$ Ohm-Meters ($\Omega$m). Accordingly, the PCB copper trace may be configured to provide the desired resistance for the current sense resistor. In the event that a higher current sense resistance is needed that can practically be provided by PCB metallization trace, a discrete resistive component may be added in series with the trace resistance.

For instance, in this example, the current sense resistor $R_S$ includes a metallization trace to achieve a partial current sense resistance of $R_{S1}$. The current sense resistor $R_S$ further includes a discrete resistance component $R_{S2}$ (which could be a resistor or a device, such as a transistor, to achieve the desired resistance) mounted on the PCB 510 and coupled in series with the metallization trace $R_{S1}$ between a supply voltage rail Vdd_supply and a power rail Vdd_core for one or more core(s) 590 of an SOC 550. Thus, the resistance of the current sense resistor $R_S$ is substantially $R_{S1}+R_{S2}$.

The one or more core(s) 590 of the SOC 500 drawing current from the power rail Vdd_core produces a sense voltage $V_S$ across the sense resistor $R_S$. The sense voltage $V_S$ is provided to an on-die current sensor 560. Since, in this example, the current sense resistor is implemented, at least in part, as metallization trace $R_{S1}$ on the PCB 510, the resistance of the metallization trace $R_{S1}$ varies with temperature (e.g., higher temperature—higher resistance, lower temperature—lower resistance). Accordingly, in this example, the operating temperature of the power management circuit 500 may affect the current measurement.

To address this, the power management circuit 500 further includes a temperature sensor 515 implemented on the PCB 510 (but may also be implemented in the SOC 550). The on-die current sensor 560 reads a temperature signal $V_{TEMP}$ indicating the current operating temperature of the power management circuit 500 (or a local temperature reflective of the approximate temperature of the current sense resistor $R_S$) provided by the temperature sensor 515, and corrects the digital current value $I_D$ based on the current operating temperature reading. The remaining components of the SOC 550 operates in a similar manner as the corresponding ones of SOC 350 discussed above.

That is, the temperature-corrected digital value $I_D$ is provided to the current limit manager 570. The current limit manager 570 compares the measured current $I_D$ to one or more limits (e.g., peak limit, sustained limits, etc.), and generates a signal LV indicative of whether there are any limit violations, and the nature of the violations if any. The current reducing unit 580 responds to the LV signal if it indicates one or more current limits violations. For example, the current reducing unit 580 may be a clock control unit, which reduces a frequency of a clock supplied to the one or more core(s) 590. As the amount of power or current drawn by the core(s) 590 depends on the frequency of the clock, reducing the clock frequency results in a reduction in the power or current drawn by the core(s) 590. The current reducing unit 580 may implement the current reduction in other manners, such as operating the one or more core(s) 590 in a lower power mode, disabling one or more of the core(s) 590, and/or other manners.

Figure 6:
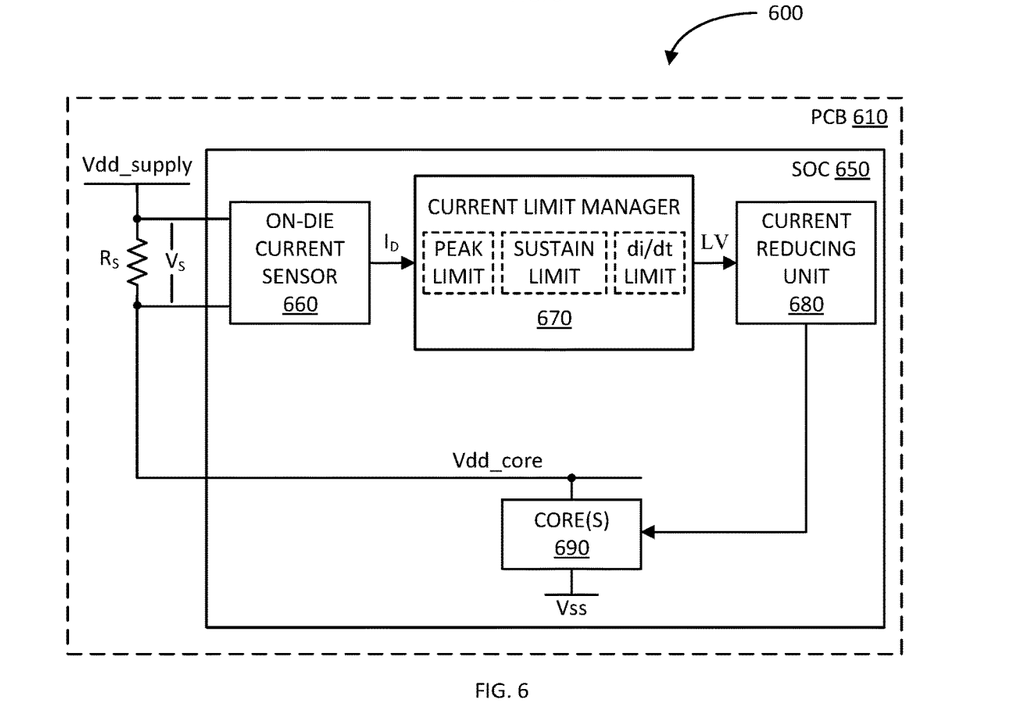
FIG. 6 illustrates a block diagram of another exemplary power management circuit with an on-board current-sense resistor, and an on-die current sensor and current limit manager that manages current based on a slew rate of the current in accordance with another aspect of the disclosure.

FIG. 6 illustrates a block diagram of another exemplary power management circuit 600 in accordance with another aspect of the disclosure. The power management circuit 600 is another variation of power management circuit 300, and includes many of the same elements as indicated by similar reference labels and numbers, with the exception that the most significant digit (MSD) of the reference numbers is a "6" in power management circuit 600 instead of a "3" as in power management circuit 300. Thus, the detailed explanation of common elements is provided above with respect to the description of power management circuit 300.

The power management circuit 600 differs from power management circuit 300 in that it includes a current limit manager 670 on an SOC 650 that also provides limits with regard to a slew rate or slope of the current (di/dt) drawn by one or more core(s) 690. The slew rate of the current may be a precursor of a peak or sustained current violation. Thus, monitoring and responding to the slew rate of the current may be another safety measure taken by the power management circuit 600 to ensure reliable operation of the SOC 650.

In this example, the current limit manager 670 may be configured similar to a proportional-integral-derivative (PID) controller for setting limits for peak current, sustained current, and current slew rate. For example, the coefficient for the proportional parameter of the PID controller may be used to set the peak current limit; the coefficient for the integral parameter of the PID controller may be used to set the sustained current limit; and the coefficient for the derivative parameter of the PID controller may be used to set the current slew rate limit. The remaining components of the power management circuit 600 operates in a similar manner as the corresponding ones of power management circuit 300 discussed above.

For instance, an on-board current sense resistor $R_S$ mounted on the PCB 610 generates a sense voltage $V_S$ when the one or more core(s) 690 draws current from a power rail Vdd_core. The on-die current sensor 660 receives the sense voltage $V_S$, and generates therefrom, a digital value $I_D$ indicative of the current drawn by the one or more core(s) 690. The digital value $I_D$ is provided to the current limit manager 670. The current limit manager 670 compares the measured current $I_D$ to one or more limits (e.g., peak limit(s), sustained limit(s), slew rate limit(s), etc.), and generates a signal LV indicative of whether there are any limit violations, and the nature of the violations if any. The current reducing unit 680 responds to the LV signal if it indicates one or more current limits violations. For example, the current reducing unit 680 may be a clock control unit, which reduces a frequency of a clock supplied to the one or more core(s) 690. As the amount of power or current drawn by the core(s) 690 depends on the frequency of the clock, reducing the clock frequency results in a reduction in the power or current drawn by the core(s) 690. The current reducing unit 680 may implement the current reduction in other manners, such as operating the one or more core(s) 690 in a lower power mode, disabling one or more of the core(s) 690, and/or other manners.

Figure 7A:
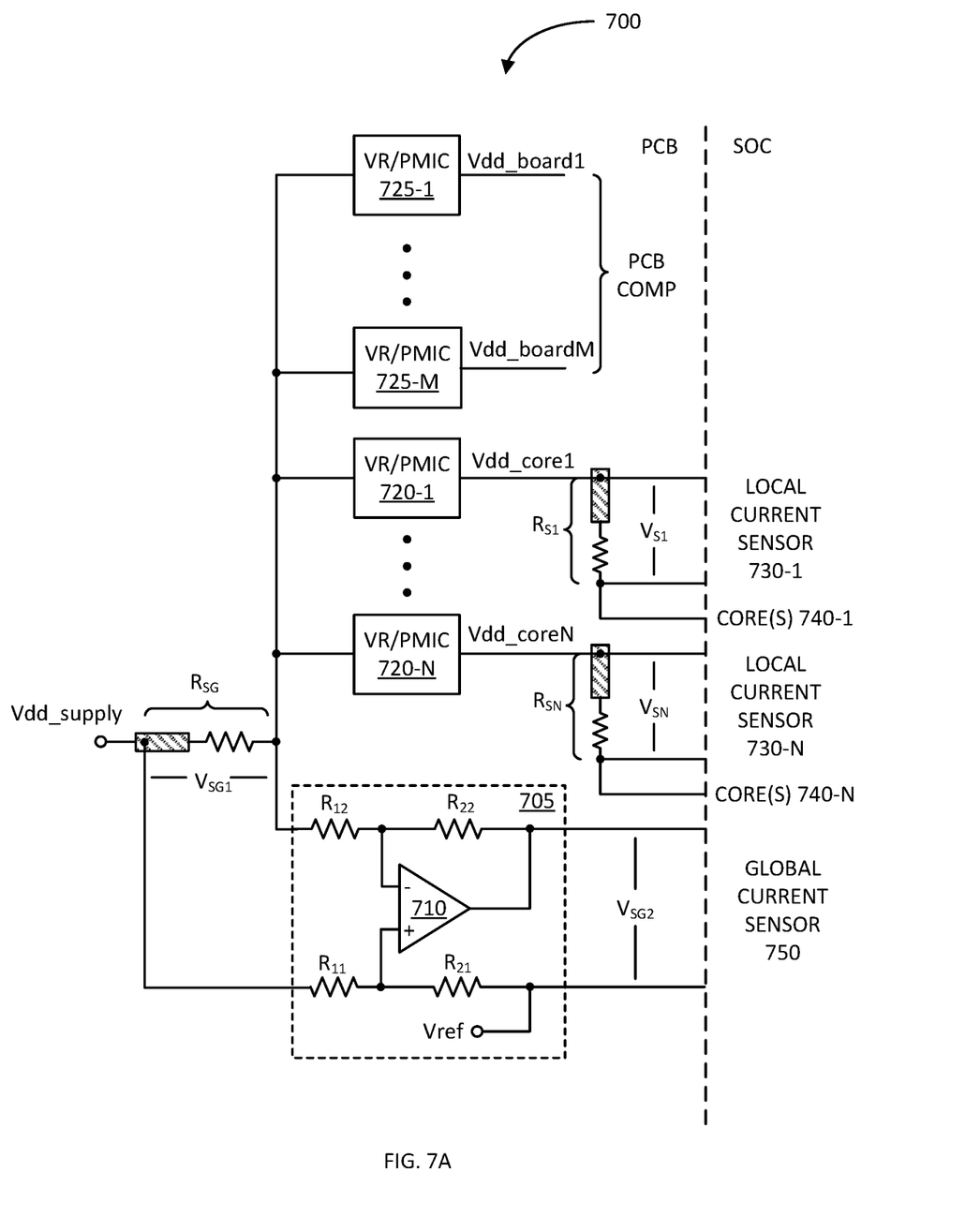
FIG. 7A illustrates a block/schematic diagram of another exemplary power management circuit with on-board global and rail current-sense resistors in accordance with another aspect of the disclosure.
Figure 7B:
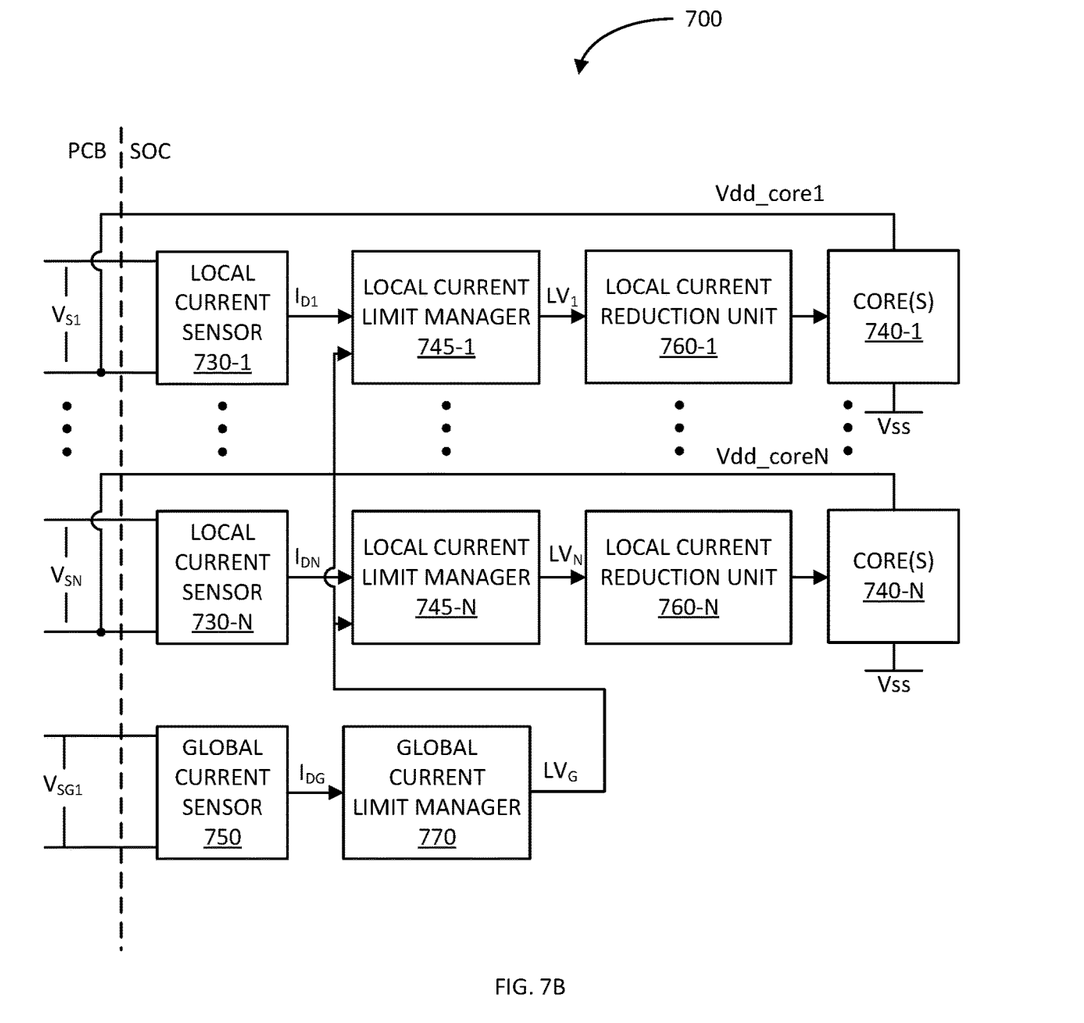
FIG. 7B illustrates a block/schematic diagram of another exemplary power management circuit with on-die global and rail current sensors and associated current limit management circuits in accordance with another aspect of the disclosure.

FIG. 7A illustrates a block/schematic diagram of another exemplary power management circuit 700 in accordance with another aspect of the disclosure. The power management circuit 700 may be a more specific implementation of the various power or current management techniques previously discussed. FIG. 7A illustrates the PCB-side of the power management circuit 700. As discussed further herein, FIG. 7B illustrates the on-die side of the power management circuit 700.

In particular, the power management circuit 700 includes a global sense resistor $R_{SG}$, which may include a PCB metallization trace and an optional discrete resistive component. Current drawn by substantially an entire PCB or SOC from a global power rail Vdd_supply produces a global sense voltage $V_{SG1}$ across the global sense resistor $R_{SG}$.

In this example, the voltage on the global power rail Vdd_supply may be too high for directly providing it to the SOC. Accordingly, the power management circuit 700 further includes a voltage converter 705 mounted on the PCB and configured as a differential amplifier. More specifically, the voltage converter 705 includes an operational amplifier 710; a resistor $R_{11}$ coupled between the high-side of the global current sense resistor $R_{SG}$ and a positive input of the operational amplifier 710; another resistor $R_{12}$ coupled between the low-side of the global current sense resistor $R_{SG}$ and a negative input of the operational amplifier 710; another resistor $R_{21}$ coupled between the positive input of the operational amplifier 710 and an input of a global current sensor 750 in the SOC; and another resistor $R_{22}$ coupled between the negative input of the operational amplifier 710 and an output of the operational amplifier 710 and another input of the global current sensor 750 in the SOC.

The voltage converter 705 down converts the sense voltage $V_{SG1}$ across the global sense resistor $R_{SG}$ to generate a sense voltage $V_{SG2}$ suitable for receiving by the global current sensor 750. A reference voltage Vref may be applied between the resistor $R_{21}$ and the global current sensor 750 for setting the common mode voltage of the sense voltage $V_{SG2}$.

The global supply voltage Vdd_supply may be applied to one or more voltage regulators (VRs) or power management integrated circuits (PMICs) 720-1 to 720-N and 725-1 to 725-M by way of the global sense resistor $R_{SG}$. The one or more VRs or PMICs 720-1 to 720-N generates one or more different local rail supply voltages Vdd_core1 to Vdd_coreN based on the global supply voltage Vdd_supply. The rail voltages Vdd_core1 to Vdd_coreN may be provided to one or more cores 740-1 to 740-N by way of a set of one or more sense resistors $R_{S1}$ to $R_{SN}$, respectively. The sense resistors $R_{S1}$ to $R_{SN}$ produce sense voltages $V_{S1}$ to $V_{SN}$ in response to the one or more cores 740-1 to 740-N drawing current from the local power rails Vdd_core1 to Vdd_coreN, respectively. The sense voltages $V_{S1}$ to $V_{SN}$ are provided to a set of one or more local current sensors 730-1 to 730-N in the SOC, respectively.

The one or more VRs or PMICs 725-1 to 725-N generates one or more different rail voltages Vdd_board1 to Vdd_boardM for components on the PCB (separate from the SOC) based on the global supply voltage Vdd_supply. Such PCB components may include dynamic random access memory (DRAM) modules, level-shifters, board temperature sensors, etc. Thus, the sense voltage $V_{SG1}$ across the global sense resistor $R_{SG}$, and the down converted sense voltage $V_{SG2}$ provided to the global current sensor 750 may be a measurement of the total current consumed by the PCB (e.g., by the PCB components and the SOC).

FIG. 7B illustrates a block/schematic diagram of the SOC-side of the exemplary power management circuit 700 in accordance with another aspect of the disclosure. As discussed, the SOC includes the one or more local current sensors 730-1 to 730-N, and the global current sensor 750. The local current sensors 730-1 to 730-N generate digital values $I_{D1}$ to $I_{DN}$ indicative of the current drawn by the cores 740-1 to 740-N, respectively. Similarly, the global current sensor 750 generates a global digital value $I_{DG}$ indicative of the total current drawn by the SOC.

The SOC further includes a set of one or more local current limit managers 745-1 to 745-N configured to generate current limit violation signals $LV_1$ to $LV_N$ based, at least in part, on the digital values $I_{D1}$ to $I_{DN}$, respectively. The SOC further includes a global current limit manager 770 configured to generate a global current limit violation signal $LV_G$ based on the global digital value $I_{DG}$. The global current limit violation signal $L_{VG}$ is provided to the one or more local current limit managers 745-1 to 745-N. The local current limit managers 745-1 to 745-N may also generate the local current limit violations signal $LV_1$ to $LV_N$ based on the global current limit violation signal $LV_G$ in order to maintain the global current within the specified limits.

The SOC further includes a set of one or more local current reduction units 760-1 to 760-N configured to reduce the current drawn by the one or more cores 740-1 to 740-N in response to current limit violations indicated by local current limit violations signals $LV_1$ to $LV_N$, respectively. As discussed, this may be done in a number of ways, such as reducing the frequency of the clock provided to the cores, operating the cores in a lower power mode, disabling one or more circuits within the cores, etc.

Figure 8:
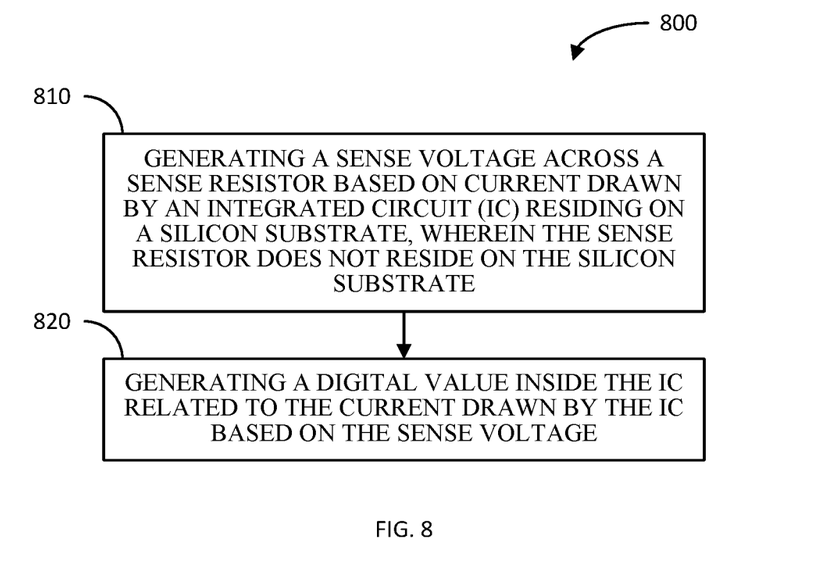
FIG. 8 illustrates a flow diagram of an example method of measuring a current drawn by an integrated circuit in accordance with another aspect of the disclosure.

FIG. 8 illustrates a flow diagram of an example method 800 of measuring a current drawn by an integrated circuit in accordance with another aspect of the disclosure. The method 800 includes generating a sense voltage across a sense resistor based on current drawn by an integrated circuit (IC) residing on a silicon substrate, wherein the sense resistor does not reside on the silicon substrate (block 810). The method 800 further includes generating a digital value inside the IC related to the current drawn by the IC based on the sense voltage (block 820).

Figure 9:
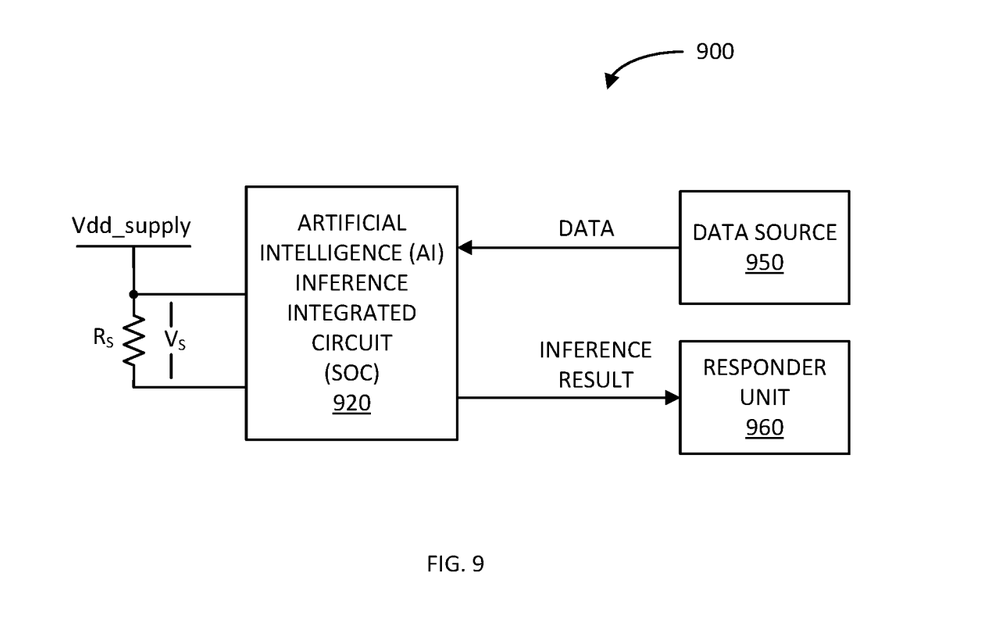
FIG. 9 illustrates a block diagram of an example artificial intelligence (AI) inference apparatus in accordance with another aspect of the disclosure.

FIG. 9 illustrates a block diagram of an example artificial intelligence (AI) inference apparatus 900 in accordance with another aspect of the disclosure. The AI inference 900 may take a form factor of a network edge server, data center server, desktop computer, laptop computer, smart phone, tablet device, Internet of Things (IoT), and other types of computing devices.

The AI apparatus 900 includes an off-die sense resistor $R_S$ and an integrated circuit (IC) 920 residing on a die or silicon substrate. As discussed, the IC 920 may be configured as a system on chip (SOC), which may include one or more AI inference data processing core(s). As depicted, the sense resistor $R_S$ is coupled to a power or supply voltage rail Vdd_supply and to the IC 920 for providing a sense voltage $V_S$ across the sense resistor $R_S$ to the IC 920 for measurement, management, and control of current or power drawn by the one or more AI inference data processing core(s).

The AI inference apparatus 900 may be coupled to a data source 950, which provides data to the one or more AI inference data processing core(s) of the AI inference IC or SOC 920. The data source 950 may be a database situated on a memory device, such as a hard drive, solid state drive, or other memory device, one or more sensors, and/or other device capable of generating data. The AI inference IC or SOC 920 may receive the data from the data source 950 via a data bus, local area network (LAN), wide area network (WAN), or other types of data communication mediums.

The one or more AI inference data processing core(s) of the AI inference IC or SOC 920 processes the data received from the data source 950 based on one or more models (e.g., generated via training session) to generate one or more inference results. For example, the data from the data source 950 may be data related to inventory of items on shelves at a retail establishment. The one or more AI inference data processing core(s) of the AI inference IC or SOC 920 may process the data to generate the inference result indicating when and which shelves to restock with the corresponding items. Considering another example, the data from data source 950 may be traffic data at an intersection or road. The one or more AI inference data processing core(s) of the AI inference IC or SOC 920 may process the data to generate the inference result indicating how to control the corresponding traffic light or traffic entrance onto a road for improved traffic flow. Although two examples are provided, it shall be understood that there are many other applications where AI inference processing are applicable.

The AI inference apparatus 900 may also be coupled to a responder unit 960, which receives the inference result generated by the one or more AI inference data processing core(s) of the AI inference IC or SOC 920. The responder unit 960 may be any type of control and/or computing device, which responds to the inference result generated by the one or more AI inference data processing core(s) of the AI inference IC or SOC 920. Considering the above examples, the responder unit 960 may be a computing device located at the retail establishment to indicate to a user (e.g., an employee) to restock the identified shelf or shelves with the corresponding items based on the inference result. Or, the responder unit 960 may be traffic light unit at an intersection or entrance to a road to control the state of the traffic light based on the inference result. The inference result may be sent from the IC or SOC 920 to the responder unit 960 via a data bus, local area network (LAN), wide area network (WAN), or other types of data communication mediums.

Although AI inference processing may be an example application to which the power management techniques described herein is applicable, it shall be understood that the power management techniques described herein may be applicable to other applications, including power management for a MODEM chip of a wireless communication device or infrastructure product (e.g., base station), a vehicle or automotive control chip, as well as others.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   an integrated circuit (IC) residing on a silicon substrate, wherein the IC includes a current sensor;
   a sense resistor, not residing on the silicon substrate, coupled to a first input of the current sensor; and
   a voltage converter, situated outside of the IC, including an input coupled to the sense resistor and an output coupled to the first input of the current sensor, wherein the voltage converter comprises:
   an operational amplifier including first and second inputs and an output;
   a first resistor coupled between a first terminal of the sense resistor and the first input of the operational amplifier;
   a second resistor coupled between a second terminal of the sense resistor and the second input of the operational amplifier;
   a third resistor coupled between the first input of the operational amplifier and the first input of the current sensor and the output of the operational amplifier, respectively; and
   a fourth resistor coupled between the second input of the operational amplifier and a second input of the current sensor.

2. The apparatus of claim 1, wherein the sense resistor is mounted on a printed circuit board (PCB).

3. The apparatus of claim 1, wherein the IC and the sense resistor are situated within an IC package.

4. The apparatus of claim 1, further comprising a temperature sensor coupled to a second input of the current sensor.

5. The apparatus of claim 1, wherein the IC further includes a current limit manager including an input coupled to an output of the current sensor.

6. The apparatus of claim 5, wherein the IC further comprises:
   a current reducing unit including an input coupled to an output of the current limit manager; and
   one or more cores including an input coupled to an output of the current reducing unit.

7. The apparatus of claim 1, wherein the IC further comprises one or more cores, wherein the sense resistor is coupled between a power rail and the one or more cores.

8. The apparatus of claim 7, further comprising a voltage regulator (VR) coupled in series with the sense resistor between the power rail and the one or more cores.

9. The apparatus of claim 7, further comprising a power management integrated circuit (IC) coupled in series with the sense resistor between the power rail and the one or more cores.

10. An apparatus, comprising:
    a printed circuit board (PCB);
    a sense resistor mounted on the PCB;
    an integrated circuit (IC) mounted on the PCB, wherein at least a portion of the IC draws current from a power rail, wherein the sense resistor is coupled between the power rail and the IC, wherein the sense resistor is configured to produce a first sense voltage in response to the current drawn by the at least portion of the IC, and wherein the IC includes a current sensor configured to generate a signal indicative of the current drawn by the at least portion of the IC based on the first sense voltage; and
    wherein the PCB further comprises a voltage converter configured to convert the first sense voltage into a second sense voltage, wherein the current sensor is configured to generate the signal indicative of the current drawn by the at least portion of the IC based on the second sense voltage wherein the voltage converter comprises:
    an operational amplifier including first and second inputs and an output;
    a first resistor coupled between a first terminal of the sense resistor and the first input of the operational amplifier;
    a second resistor coupled between a second terminal of the sense resistor and the second input of the operational amplifier;
    a third resistor coupled between the first input of the operational amplifier and the first input of the current sensor and the output of the operational amplifier, respectively; and
    a fourth resistor coupled between the second input of the operational amplifier and a second input of the current sensor.

11. The apparatus of claim 10, wherein the sense resistor includes a metallization trace of the PCB.

12. The apparatus of claim 10, further comprising a temperature sensor configured to generate a temperature signal indicative of an operating temperature of the sense resistor, wherein the current sensor is configured to generate the signal indicative of the current drawn by the at least portion of the IC based on the temperature signal.

13. The apparatus of claim 10, wherein the IC further includes a current limit manager configured to generate a limit violation signal indicative of whether the current drawn by the at least portion of the IC violates one or more defined limits.

14. The apparatus of claim 13, wherein the one or more defined limits includes a peak current limit, a sustained current limit, and a current slew rate limit.

15. The apparatus of claim 13, wherein the IC further comprises a current reducing unit configured to reduce the current drawn by the at least portion of the IC in response to the limit violation signal.

16. The apparatus of claim 15, wherein the current reducing unit is configured to reduce the current drawn by the at least portion of the IC by reducing a frequency of a clock supplied to the at least portion of the IC.

17. The apparatus of claim 10, wherein the PCB further comprises a set of one or more voltage regulators (VRs), wherein the set of one or more VRs is configured to generate a set of one or more supply voltages, respectively.

18. The apparatus of claim 17, wherein the at least portion of the IC is configured to draw currents from the set of one or more VRs.

19. The apparatus of claim 18, wherein the PCB further comprises a set of one or more current sense resistors coupled between the set of one or more VRs and the at least portion of the IC, wherein the set of one or more current sense resistors are configured to generate a set of one or more sense voltages, respectively.

20. The apparatus of claim 19, wherein the IC further includes a set of one or more current sensors configured to generate a set of one or more digital values indicative of current drawn from the set of one or more VRs by the at least portion of the IC based on the set of one or more sense voltages, respectively.

21. The apparatus of claim 20, wherein the IC further includes a set of one or more current limit managers configured to generate a set of one or more current limit violation signals based on the set of one or more digital values, respectively.

22. The apparatus of claim 21, wherein the IC further includes a set of one or more current reduction units configured to reduce the current drawn by the at least portion of the IC based on the set of one or more current limit violations signal, respectively.

23. The apparatus of claim 21, wherein the IC further comprises:
 another current sensor configured to generate another digital value based on the first sense voltage; and
 another current limit manager configured to generate another current limit violation signal based on the another digital value.

24. The apparatus of claim 23, wherein the set of one or more current limit managers are configured to generate the set of one or more current limit violation signals based on the another current limit violation signal.

25. The apparatus of claim 10, wherein the PCB further comprises one or more PCB components, wherein the sense resistor is configured to produce the first sense voltage based on current drawn by the one or more PCB components.

26. The apparatus of claim 10, wherein the PCB further comprises a set of one or more power management integrated circuits (PMICs), wherein the set of one or more PMICs is configured to generate a set of one or more supply voltages, respectively, wherein the at least portion of the IC is configured to draw currents from the set of one or more PMICs.

27. An artificial intelligence (AI) inference apparatus, comprising:
 an integrated circuit (IC) residing on a silicon substrate, wherein the IC includes a current sensor and one or more artificial intelligence (AI) inference data processing cores;
 a sense resistor, not residing on the silicon substrate, coupled to an input of the current sensor, and between a power rail and the one or more AI inference data processing cores; and
 a voltage converter, situated outside of the IC, including an input coupled to the sense resistor and an output coupled to the first input of the current sensor, wherein the voltage converter comprises:
  an operational amplifier including first and second inputs and an output;
  a first resistor coupled between a first terminal of the sense resistor and the first input of the operational amplifier;
  a second resistor coupled between a second terminal of the sense resistor and the second input of the operational amplifier;
  a third resistor coupled between the first input of the operational amplifier and the first input of the current sensor and the output of the operational amplifier, respectively; and
  a fourth resistor coupled between the second input of the operational amplifier and a second input of the current sensor.

28. The (AI) inference apparatus of claim 27, wherein the IC further includes a current limit manager including an input coupled to an output of the current sensor.

29. The (AI) inference apparatus of claim 28, wherein the IC further comprises:
 a current reducing unit including an input coupled to an output of the current limit manager, and an output coupled to the one or more (AI) inference processing cores.

30. The apparatus of claim 1, wherein the second input of the current sensor is configured to receive a reference voltage to set a common mode voltage across the first and second inputs of the current sensor.

31. The apparatus of claim 1, wherein the voltage converter isolates the IC from a voltage at a terminal of the sense resistor that is too high to be directly applied to the current sensor.

32. The apparatus of claim 10, wherein the second input of the current sensor is configured to receive a reference voltage to set a common mode voltage across the first and second inputs of the current sensor.

33. The apparatus of claim 27, wherein the second input of the current sensor is configured to receive a reference voltage to set a common mode voltage across the first and second inputs of the current sensor.

* * * * *